United States Patent
Hur et al.

(10) Patent No.: US 7,808,851 B2
(45) Date of Patent: Oct. 5, 2010

(54) TEST CIRCUIT FOR MULTI-PORT MEMORY DEVICE

(75) Inventors: Hwang Hur, Kyoungki-do (KR); Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/474,243

(22) Filed: May 28, 2009

(65) Prior Publication Data

US 2009/0290436 A1    Nov. 26, 2009

Related U.S. Application Data

(62) Division of application No. 11/524,023, filed on Sep. 19, 2006, now Pat. No. 7,599,242.

(30) Foreign Application Priority Data

Sep. 28, 2005 (KR) ............. 2005-0090857
May 8, 2006 (KR) ............. 2006-0041190

(51) Int. Cl.
  *G11C 29/00* (2006.01)
(52) U.S. Cl. ............. 365/201; 365/230.05; 365/230.03
(58) Field of Classification Search ................. 365/201, 365/230.05, 230.03
  See application file for complete search history.

(56) References Cited

U.S. PATENT DOCUMENTS

| | | | |
|---|---|---|---|
| 5,014,235 A | 5/1991 | Morton | 365/185.11 |
| 5,436,911 A | 7/1995 | Mori | |
| 5,546,569 A | 8/1996 | Proebsting et al. | 365/189.04 |
| 5,717,873 A | 2/1998 | Rabe et al. | |
| 5,796,745 A | 8/1998 | Adams et al. | |
| 5,872,994 A | 2/1999 | Akiyama et al. | |
| 5,940,603 A | 8/1999 | Huang | 365/189.04 |
| 6,070,256 A | 5/2000 | Wu et al. | |
| 6,178,532 B1 | 1/2001 | Pierce et al. | |
| 6,216,241 B1 | 4/2001 | Fenstermaker et al. | |
| 6,360,344 B1 | 3/2002 | Khoche et al. | |
| 6,557,127 B1 | 4/2003 | Adams et al. | |
| 6,618,826 B1 | 9/2003 | Chen et al. | |
| 6,681,358 B1 | 1/2004 | Karimi et al. | |
| 6,788,575 B2 * | 9/2004 | Kozakai et al. | 365/185.09 |
| 6,922,800 B2 | 7/2005 | Chen et al. | |
| 7,120,761 B2 | 10/2006 | Matsuzaki et al. | 365/230.05 |
| 7,660,184 B2 * | 2/2010 | Kobayashi | 365/230.03 |
| 2003/0137308 A1 | 7/2003 | Wang | |
| 2005/0251713 A1 | 11/2005 | Lee | |
| 2010/0091594 A1 * | 4/2010 | Kobayashi | 365/200 |

FOREIGN PATENT DOCUMENTS

| | | |
|---|---|---|
| JP | 63-102094 | 5/1988 |
| JP | 2001-296337 | 10/2001 |

(Continued)

*Primary Examiner*—Tuan T. Nguyen
(74) *Attorney, Agent, or Firm*—Blakely, Sokoloff, Taylor & Zafman

(57) ABSTRACT

A semiconductor memory device includes a read bus line for transferring read data; a write bus line for transferring write data; and a temporary data storage unit connected between the read bus line and the write bus line and controlled by a test mode signal enabled during a test mode.

17 Claims, 4 Drawing Sheets

| | FOREIGN PATENT DOCUMENTS | | |
|---|---|---|---|
| JP | 2005-322375 | 11/2005 | |
| KR | 1999-0068881 | 6/2000 | |
| KR | 2000-0046815 | 7/2000 | |
| TW | 504696 | 10/2002 | |
| TW | 200421079 | 10/2004 | |

* cited by examiner

TEST CIRCUIT FOR MULTI-PORT MEMORY DEVICE

The present patent application is a Divisional of application Ser. No. 11/524,023, filed Sep. 19, 2006 now U.S. Pat. No. 7,599,242.

FIELD OF THE INVENTION

The present invention relates to a semiconductor memory device, and more particularly, to a test circuit for testing peripheral circuits in a multi-port memory device.

DESCRIPTION OF RELATED ARTS

Generally, most memory devices including a dynamic random access memory (DRAM) device are used in appliance devices for audio and video such as a high definition television (HDTV) and a liquid crystal display (LCD) TV as well as a conventional field such as a desktop computer, a notebook computer, and a server. For reasons set forth below, there is a demand for memory devices that can satisfy an input/output (I/O) method different from the conventional I/O method. The conventional I/O method may be a data transmission method using a single port with a plurality of input/output pin sets, i.e., a parallel I/O interface.

Considering the disadvantage of the parallel I/O interface, many attempts to change the parallel I/O interface into a serial I/O interface have been made. The serial I/O interface receives external data in series through a small number of bus lines and internally parallelizes the received data.

Consequently, the manufacturing cost of the serial I/O interface decreases because it uses a small number of bus lines. Further, the serial I/O interface is applicable to a multi-port memory device because it does not require a single port with a plurality of input/output pin sets.

The multi-port memory device includes a plurality of ports, each port performing an independent operation. As a result, the multi-port memory device may simultaneously deal with a large quantity of video and audio data demanded from multimedia.

The conventional DRAM device may deal with a single operation due to the single port and, thus, it is only possible to perform another operation after finishing the previous operation. The multi-port memory device may overcome the above limitation of the conventional DRAM device so that application of the multi-port memory device is extended farther.

In the above multi-port memory device, a high frequency data processing logic is necessary to parallelize serial data and serialize parallel data.

As an operation for high frequency data processing is performed, it is difficult to verify an operation of the high frequency data processing logic when faultiness relating to memory cells included in the DRAM device occurs. Further, when a time margin between logical signals of the high frequency data processing logic is set to be tight, faultiness relating to the time margin may occur. Accordingly, a test circuit is required to verify whether a specific faultiness is related to the memory cells included in the DRAM device or the time margin of the high frequency data processing logic.

SUMMARY OF THE INVENTION

It is, therefore, an object of the present invention to provide a semiconductor memory device for testing peripheral devices under high frequency circumstance regardless of defects of a memory cell.

It is another object of the present invention to provide a semiconductor memory device for testing a circuit for performing a read operation under high frequency circumstance regardless of defects of a memory cell.

It is another object of the preset invention to provide a semiconductor memory device for testing a circuit for performing a write operation under high frequency circumstance regardless of defects of a memory cell.

In accordance with an aspect of the present invention, there is provided a semiconductor memory device including: a read bus line for transferring read data; a write bus line for transferring write data; and a temporary data storage unit connected between the read bus line and the write bus line and controlled by a test mode signal enabled during a test mode.

In accordance with another aspect of the present invention, there is provided a multi-port memory device including a plurality of banks; and a plurality of bank control logic circuits for controlling a signal transmission between global I/O lines and the banks, wherein the number of bank control logic circuits corresponds to that of banks and the multi-port memory device and are configured to test peripheral circuits under high frequency circumstance regardless of defects of a memory cell.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a test circuit for testing peripheral circuits in a semiconductor memory device in accordance with exemplary embodiments of the present invention will be described in detail with reference to the accompanying drawings.

Figure 1:
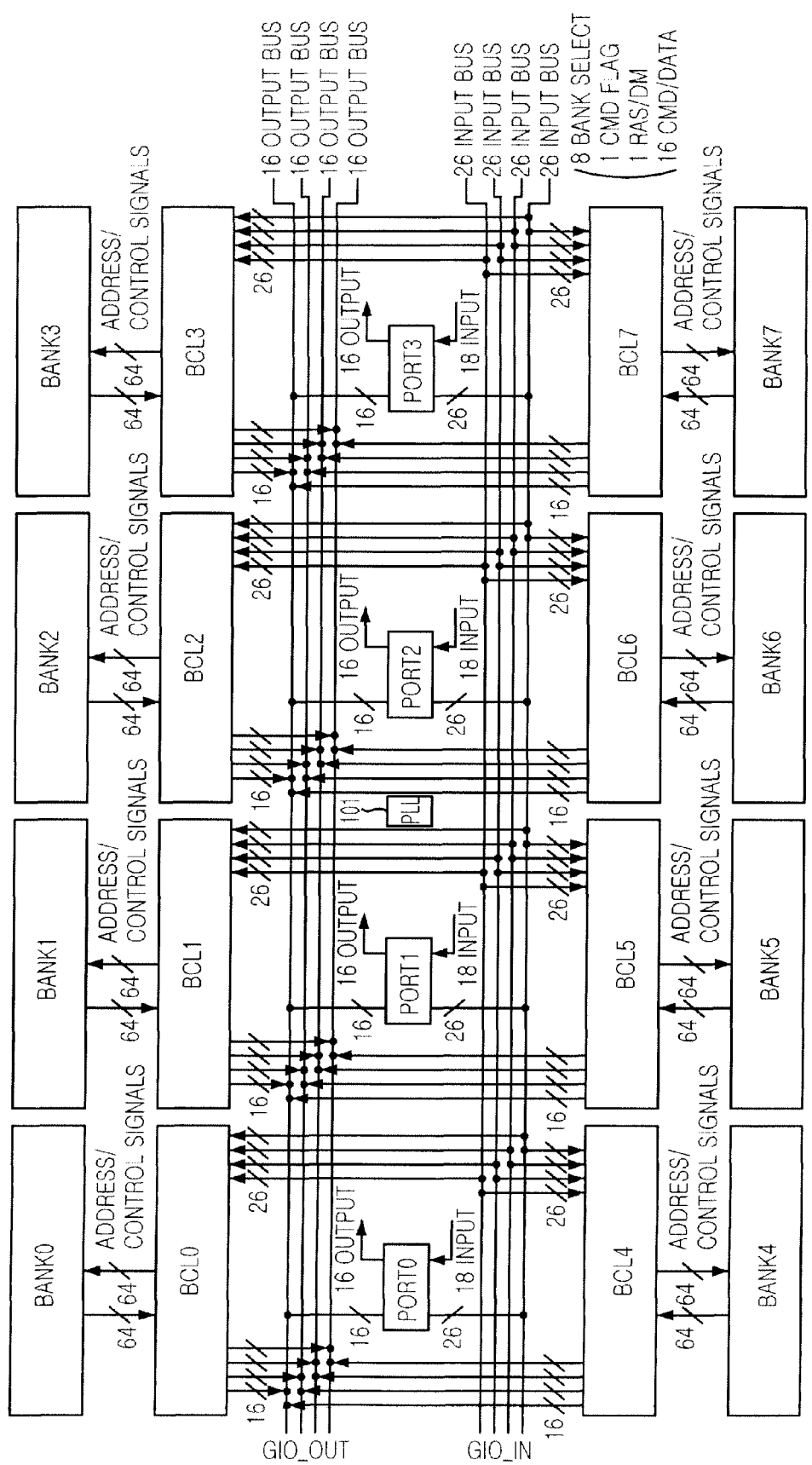
FIG. 1 is a block diagram of a multi-port memory device in accordance with the present invention.

FIG. 1 is a block diagram of a multi-port memory device in accordance with the present invention. For convenience of explanation, a multi-port memory device having four ports and eight banks is illustrated. Particularly, it is assumed that the multi-port memory device has a 16-bit data frame and performs a 64-bit prefetch operation.

As shown, the multi-port memory device in accordance with the present invention includes first to fourth ports PORT0 to PORT3, first to eighth banks BANK0 to BANK7, first and second global input/output (I/O) lines GIO_OUT and GIO_IN, first to eighth bank control logic circuits BCL0 to BCL7, and a phase locked loop PLL.

Each of the first to fourth ports PORT0 to PORT3 independently performs a serial communication with external devices. The first to eighth banks BANK0 to BANK7 are divided into upper banks BANK0 to BANK3 and lower banks BANK4 to BANK7 which are divided by the first to fourth ports PORT0 to PORT3 and arranged in a row direction.

The first global I/O line GIO_OUT is arranged in the row direction between the upper banks BANK0 to BANK3 and the first to fourth ports PORT0 to PORT3, and transmits output data in parallel. The second global I/O line GIO_IN is arranged in the row direction between the lower banks BANK4 to BANK7 and the first to fourth ports PORT0 to PORT3, and transmits input data in parallel.

The first to eighth bank control logic circuits BCL0 to BCL7 control a signal transmission between the first and second global I/O lines GIO_OUT and GIO_IN and the first to eighth banks BANK0 to BANK7. The phase locked loop PLL is located between the second port PORT1 and the third port PORT2 and generates an internal clock. An internal command and the input and output data are input to the first to fourth ports PORT0 to PORT3 in response to the internal clock.

Figure 2:
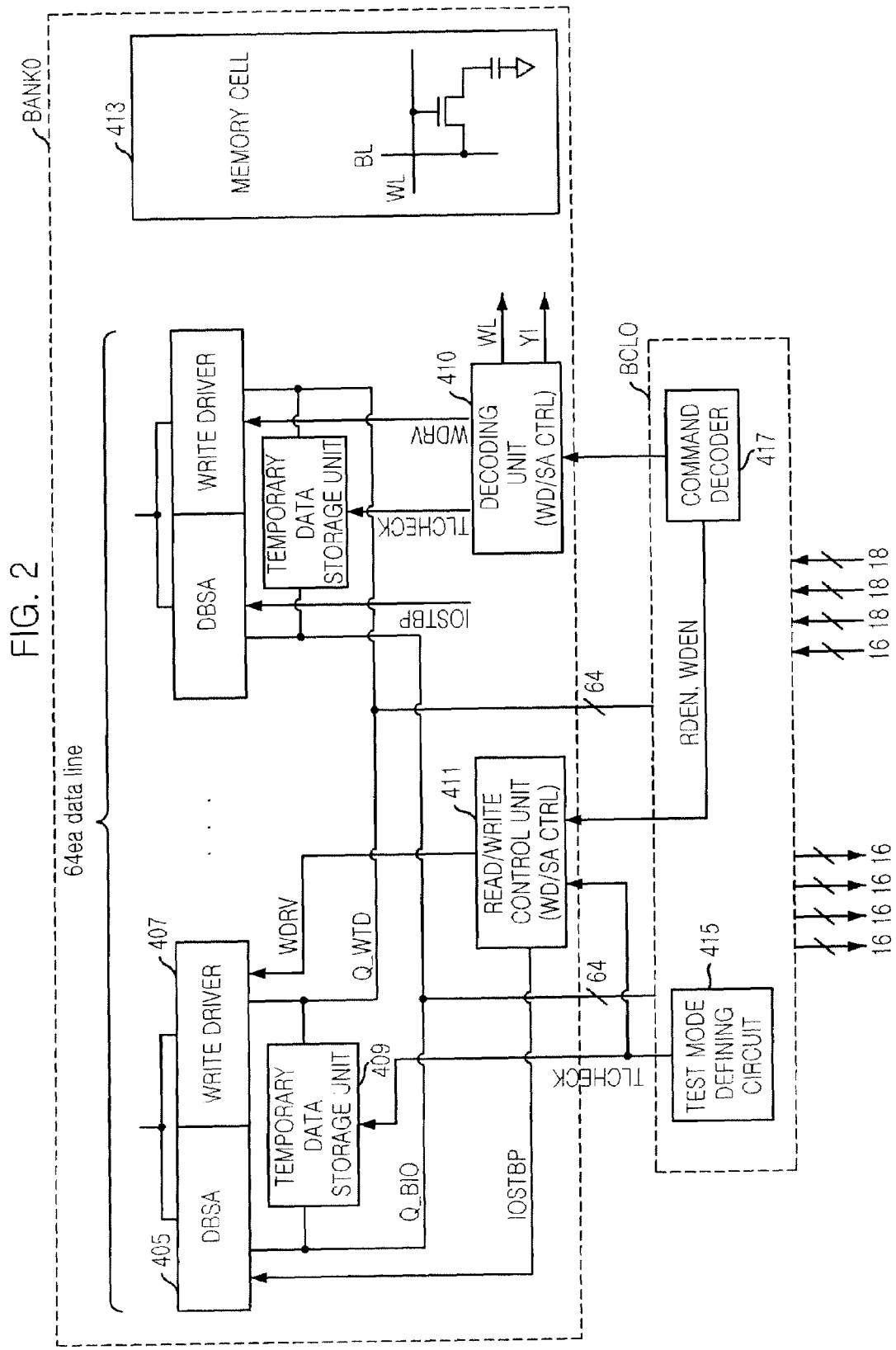
FIG. 2 is a detailed block diagram of a first bank and a first bank control logic illustrated in FIG. 1.

FIG. 2 is a detailed block diagram of the first bank BANK0 and the first bank control logic BCL0 as illustrated in FIG. 1. The other banks BANK1 to BANK7 and the other bank control logic circuits BCL1 to BCL7 have the same structure with those of the first bank BANK0 and the first bank control logic BCL0.

As shown, the first bank control logic BCL0 includes a test mode defining circuit 415 and a command decoder 417. The command decoder 417 receives an internal command, such as an active command, a read command and a write command, and generates a read flag signal RDEN and a write flag signal WDEN. The test mode defining circuit 415 generates a test mode signal TLCHECK defining a test mode based on a test mode setting for verifying an operation of a high frequency data processing logic.

The first bank BANK0 includes a plurality of data bus sense amplifiers (DBSAs) 405, a plurality of write drivers 407, a temporary data storage unit 409, a decoding unit 410, and a read/write control unit 411.

The decoding unit 410 decodes the read flag signal RDEN and the write flag signal WDEN output from the command decoder 417 to drive a specific word line WL of a memory cell 413 and generate a signal for driving a specific YI transistor. The YI transistor connects a bit line BL and a segment input/output (I/O) line such as a data transfer line.

The write driver 407 performs a write operation of write data. The DBSA 405 amplifies read data output from the memory cell 413 and outputs the amplified data with 64-bit output data.

The read/write control unit 411 delays the write flag signal WDEN by a predetermined time in consideration of a margin with write data to generate a write signal WDRV for controlling the write driver 407, and receives the read flag signal RDEN to generate a read signal IOSTBP for controlling the DBSA 405.

The temporary data storage unit 409 shares data between a read bus line Q_BIO and a write bus line Q_WTD and temporarily saves the data based on the test mode signal TLCHECK. The read bus line Q_BIO shares data between the first bank control logic BCL0 and the DBSA 405 and data between the plurality of DBSAs, and the write bus line Q_WTD shares data between the first bank control logic BCL0 and the write driver 407 and data between the plurality of write drivers. In detail, the temporary data storage unit 409 temporarily saves the write data from an external source as the read data during test mode, and uses the saved data as read/write data for verifying the high frequency data processing logic.

Figure 3:
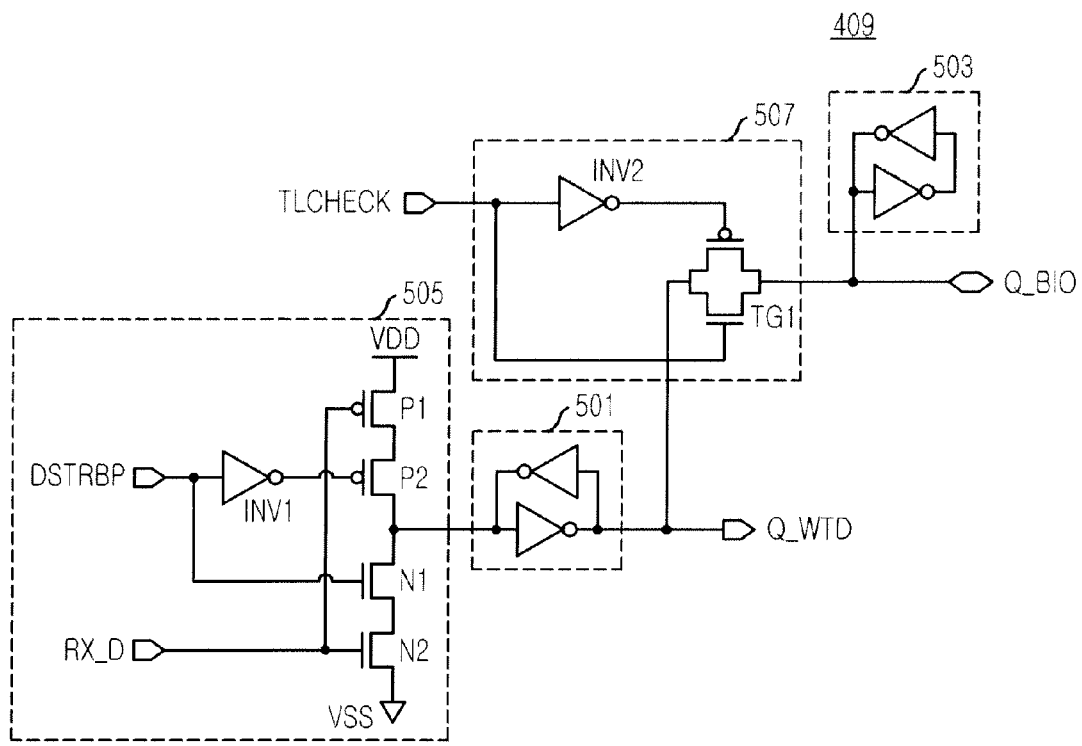
FIG. 3 is a circuit diagram of a temporary data storage unit shown in FIG. 2 in accordance with a first embodiment of the present invention.

FIG. 3 is a circuit diagram of the temporary data storage unit 409 shown in FIG. 2 in accordance with a first embodiment of the present invention. Herein, a signal RX_D denotes write data from the first bank control logic BCL0, and a signal DSTRBP denotes a data flag signal of the signal RX_D.

As shown, the temporary data storage unit 409 includes a data input unit 505, a sharing control unit 507, and first and second latch units 501 and 503.

The data input unit 505 receives the write data RX_D and applies the received signal to the write bus line Q_WTD. The first latch unit 501 is located on the write bus line Q_WTD and latches the write data RX_D as an output of the data input unit 505. The sharing control unit 507 shares the write data RX_D applied on the write bus line Q_WTD with the read bus line Q_BIO. The second latch unit 503 is located on the read bus line Q_BIO and latches the write data RX_D applied on the read bus line Q_BIO.

In detail, the data input unit 505 includes a first inverter INV1, first and second PMOS transistors P1 and P2, and first and second NMOS transistors N1 and N2.

The first inverter INV1 inverts the data flag signal DSTRBP informing a point of inputting the write data RX_D. The first NMOS transistor N1 has a gate receiving the data flag signal DSTRBP. The second PMOS transistor P2 connected to the first NMOS transistor N1 has a gate receiving an output of the first inverter INV1. The second NMOS transistor N2 connected between the first NMOS transistor N1 and a ground voltage (VSS) terminal has a gate receiving the write data RX_D. The first PMOS transistor P1 connected between the second PMOS transistor P2 and a source voltage (VDD) terminal has a gate receiving the write data RX_D.

The sharing control unit 507 includes a second inverter INV2 and a transfer gate TG1. The second inverter INV2 inverts the test mode signal TLCHECK. The transfer gate TG1 transfers the write data RX_D applied on the write bus line Q_WTD to the read bus line Q_BIO in response to the test mode signal TLCHECK.

Each of the first and second latch units 501 and 503 includes an inverter latch unit including a plurality of inverters.

When the test mode signal TLCHECK is a logic level 'LOW', i.e., during a normal mode, the write data RX_D is only applied to the write bus line Q_WTD.

When the test mode signal TLCHECK is a logic level 'HIGH', i.e., during the test mode, the transfer gate TG1 operates so as to share the write data RX_D applied to the write bus line Q_WTD with the read bus line Q_BIO. At this time, if the read command is input from the external source, the first bank control logic BCL0 outputs the read flag signal RDEN to the read/write control unit 411. The read/write control unit 411 inactivates and outputs the read signal IOSTBP as an enable signal of the DBSA 405. As a result, the write data from the memory cell 413 are not outputted, but the write data RX_D saved in the temporary data storage unit 409 are outputted.

As shown in FIG. 3, the temporary data storage unit 409 in accordance with the first embodiment of the present invention performs a single write operation in the multi-port memory device when the test mode signal TLCHECK is activated.

Figure 4:
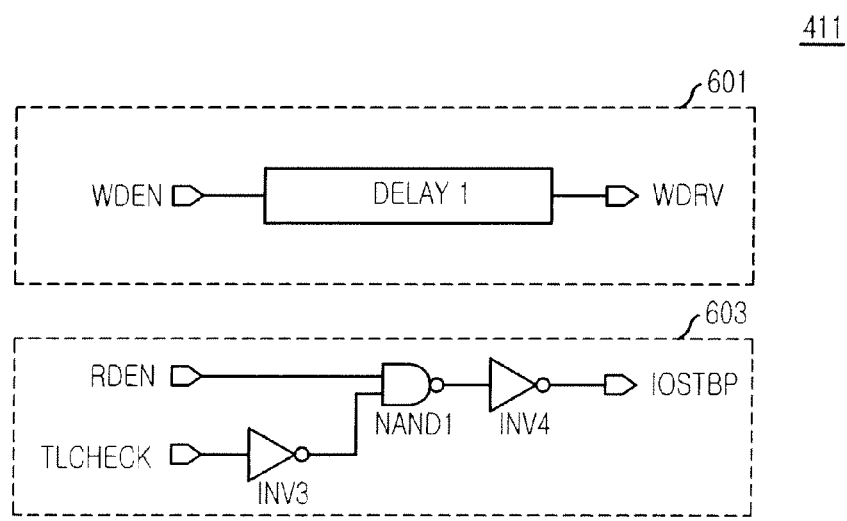
FIG. 4 is a circuit diagram of a read/write control unit illustrated in FIG. 2.

FIG. 4 is a circuit diagram of the read/write control 411 unit illustrated in FIG. 2.

As shown, the read/write control 411 includes a write signal output unit 601 and a read signal output unit 603.

The write signal output unit 601 may be implemented with a delay unit DELAY1 which delays the write flag signal WDEN by a predetermined time to output the delayed signal as the write signal WDRV.

The read signal output unit 603 outputs the read signal IOSTBP base on the test mode signal TLCHECK. In detail, the read signal output unit 603 includes first and second inverters INV3 and INV4, and a NAND gate NAND1. The first inverter INV3 inverts the test mode signal TLCHECK. The NAND gate NAND1 performs a NAND operation of an output of the first inverter INV3 and the read flag signal RDEN. The second inverter INV4 inverts an output of the NAND gate NAND1 to output the read signal IOSTBP.

As described above, the read signal output unit 603 does not output the read signal IOSTBP when the test mode signal TLCHECK is activated with a logic level 'HIGH', and outputs the read signal IOSTBP when the test mode signal TLCHECK is inactivated with a logic level 'LOW'. Accordingly, when the test mode signal TLCHECK is activated with a logic level 'HIGH', the read/write control 411 prevents data of the memory cell from being amplified and outputted during a read operation. At this time, if a write command is inputted, the write data RX_D are written to the memory cell normally because the write data RX_D are applied to the write bus line Q_WTD as well as the read bus line Q_BIO. It is possible to find faults in the DBSA 405 by comparing the read data during the test mode with the read data during the normal mode.

Figure 5:
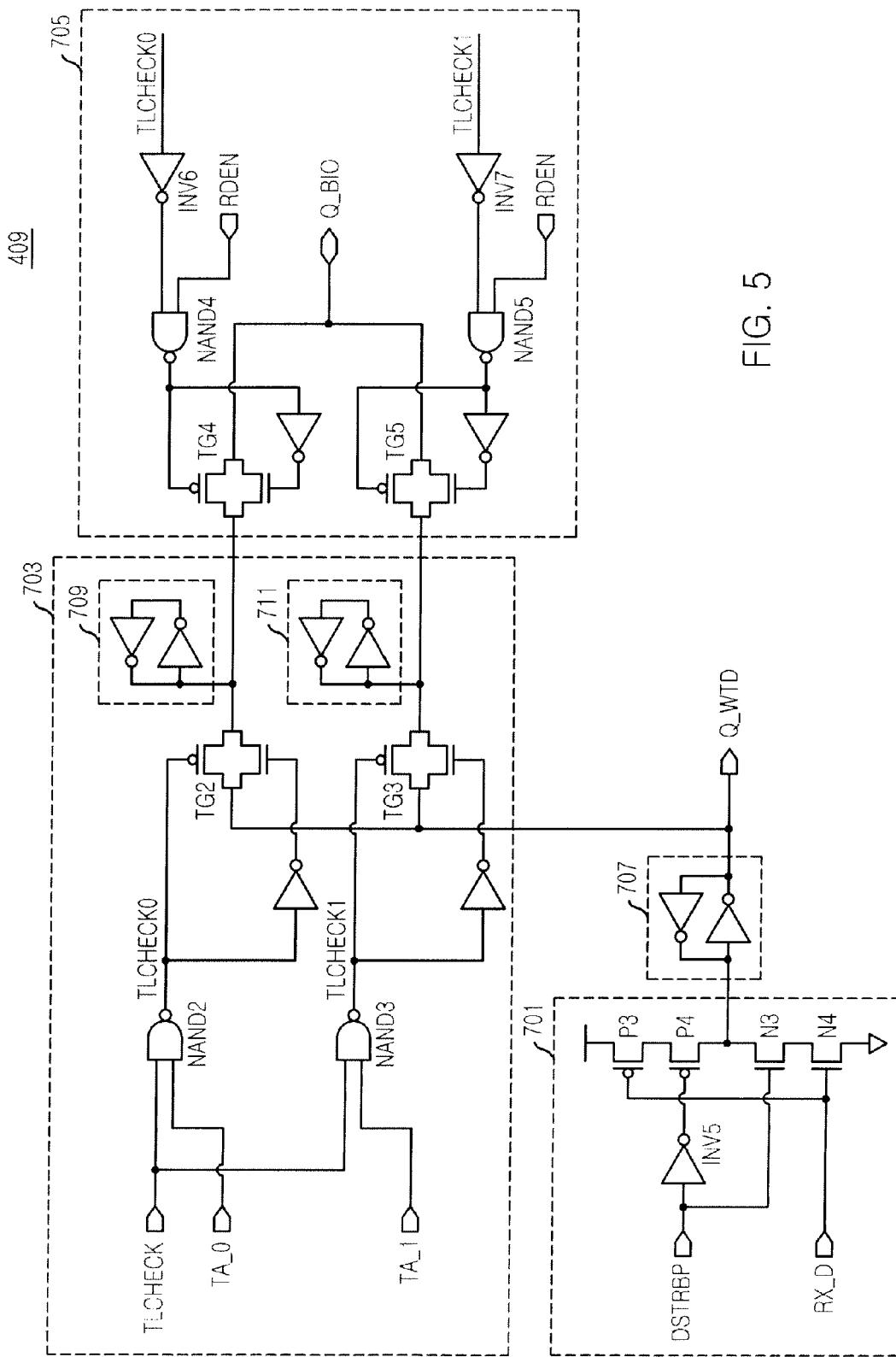
FIG. 5 is a circuit diagram of a temporary data storage unit shown in FIG. 2 in accordance with a second embodiment of the present invention.

FIG. 5 is a circuit diagram of the temporary data storage unit 409 shown in FIG. 2 in accordance with a second embodiment of the present invention. For reference, the temporary data storage unit 409 in accordance with the second embodiment of the present invention performs multiple write operations in the multi-port memory device when the test mode signal TLCHECK is activated. Particularly, the multiple write operations are performed based on address signals from the external. Herein, the number of address signals corresponds to the number of write operations to do, and the number of latch units in the temporary data storage unit 409 also corresponds to the number of write operations to do.

As shown, the temporary data storage unit 409 includes a data input unit 701, first and second sharing control units 703 and 705, and a write bus line latch unit 707. The data input unit 701 receives the write data RX_D to apply the received data to the write bus line Q_WRD. The write bus line latch unit 707 is located on the write bus line Q_WRD and latches the write data RX_D. The first and second sharing control units 703 and 705 share the write data RX_D applied to the write bus line Q_WRD with the read bus line Q_BIO.

In detail, the data input unit 701 includes a first inverter INV5, first and second NMOS transistors N3 and N4, and first and second PMOS transistors P3 and P4.

The first inverter INV5 inverts a data flag signal DSTRBP informing a point of inputting the write data RX_D. The first NMOS transistor N3 has a gate receiving the data flag signal DSTRBP. The second PMOS transistor P4 connected to the first NMOS transistor N3 has a gate receiving an output of the first inverter INV5. The second NMOS transistor N4 connected between the first NMOS transistor N3 and a ground voltage (VSS) terminal has a gate receiving the write data RX_D. The first PMOS transistor P3 connected between the second PMOS transistor P4 and a source voltage (VDD) terminal has a gate receiving the write data RX_D.

The write bus line latch unit 707 is an inverter latch unit including a plurality of inverters.

The first sharing control unit 703 includes first and second NAND gates NAND2 and NAND3, first and second transfer gates TG2 and TG3, and first and second latch units 709 and 711. The first NAND gate NAND2 performs a NAND operation of the test mode signal TLCHECK and a first test address signal TA_0. The second NAND gate NAND3 performs a NAND operation of the test mode signal TLCHECK and a second test address signal TA_1. The first transfer gate TG2 transfers the write data RX_D latched by the write bus line latch unit 707 in response to an output of the first NAND gate NAND2. The second transfer gate TG3 transfers the write data RX_D latched by the write bus line latch unit 707 in response to an output of the second NAND gate NAND3. The first latch unit 709 latches the write data RX_D connected to the first transfer gate TG2. The second latch unit 711 latches the write data RX_D connected to the second transfer gate TG3.

The second sharing control unit 705 includes second and third inverters INV6 and INV7, third and fourth NAND gates NAND4 and NAND5, and third and fourth transfer gates TG4 and TG5.

The second inverter INV6 inverts a first test mode signal TLCHECK0 output from the test mode defining circuit. The third NAND gate NAND4 performs a NAND operation of an output of the second inverter INV6 and the read flag signal RDEN. The third transfer gate TG4 transfers the write data RX_D latched by the first latch unit 709 to the read bus line Q_BIO in response to an output of the third NAND gate NAND4.

The third inverter INV7 inverts a second test mode signal TLCHECK1 output from the test mode defining circuit. The fourth NAND gate NAND5 performs a NAND operation of an output of the third inverter INV7 and the read flag signal RDEN. The fourth transfer gate TG5 transfers the write data RX_D latched by the second latch unit 711 to the read bus line Q_BIO in response to an output of the fourth NAND gate NAND5.

The temporary data storage unit 409 shown in FIG. 5 is an exemplary circuit for performing the write operations twice and thus the number of latch units, i.e., two, corresponds to the number of write operations to do. It is apparent to those skilled in the art that the number of the transfer gates, latch units and the test addresses corresponds to the number of write operations to do.

During the test mode, corresponding ones of the first and second transfer gates TG2 and TG3 are turned-on based on the test address signals TA_0 and TA_1 so that corresponding latch units save the write data RX_D. In addition, when the first and second test mode signal TLCHECK0 and TLCHECK1 are a logic level 'LOW' according to the test address signals TA_0 and TA_1, corresponding ones of the third and fourth transfer gates TG4 and TG5 are turned-on so that the latched write data RX_D are transferred to the read bus line Q_BIO.

As described above, in the present invention, the write data from the external is stored in the temporary data storage unit connected between the write bus line Q_WTD and the read bus line Q_BIO, and then the stored data are used as the read and write data during the test mode for testing the peripheral devices except for the memory cell. Accordingly, it is possible to find an error operation of peripheral devices under the high frequency circumstance regardless of defects of the memory cell.

In accordance with the present invention, it is possible to efficiently analyze faults by verifying the high frequency data processing logic as the peripheral devices, independent of the memory cell, and guarantee a stable operation of the semiconductor memory device. Further, a term for developing the semiconductor memory device, specially the multi-port memory device, may be shortened, thereby increasing its competitiveness.

The present application contains subject matter related to Korean patent application Nos. 2005-90857 and 2006-41190, filed in the Korean Intellectual Property Office on Sep. 28, 2005 and May 8, 2006, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A multi-port memory device including a plurality of ports, each port performing an independent operation, the multi-port memory device comprising:
   a plurality of banks; and
   a plurality of bank control logic circuits for controlling a signal transmission between global I/O lines and the banks,
   wherein the number of bank control logic circuits corresponds to the number of banks and the multi-port memory device is configured to test peripheral circuits under high frequency circumstance regardless of defects of a memory cell.

2. The multi-port memory device as recited in claim 1, wherein each of the bank control logic circuits includes:
   a command decoder for receiving an internal command and generating a read flag signal and a write flag signal; and
   a test mode defining circuit for generating a test mode signal defining a test mode based on an external test mode setting.

3. The multi-port memory device as recited in claim 1, wherein each of the banks includes:
   a plurality of data bus sense amplifiers, connected to a read bus line, for amplifying and outputting read data output from the memory cell;
   a plurality of write drivers, connected to a write bus line, for performing a write operation;
   a temporary data storage unit for sharing data between the read bus line and the write bus line and temporarily saving the data based on the test mode signal; and
   a read/write control unit for delaying the write flag signal by a predetermined time to generate a write signal for controlling the write drivers, and receiving the read flag signal to generate a read signal for controlling the data bus sense amplifiers.

4. The multi-port memory device as recited in claim 3, wherein each of the banks further includes a decoding unit for decoding the read flag signal and the write flag signal to drive a specific word line of the memory cell and to generate a signal for driving a specific column transistor for connecting a bit line and a segment input/output (I/O) line.

5. The multi-port memory device as recited in claim 3, wherein the temporary data storage unit includes:
   a data input unit for receiving the write data to apply the received write data to the write bus line based on a data flag signal indicating a point of inputting the write data;
   a first latch unit, located on the write bus line, for latching the write data applied on the write bus line;
   a data transferring unit for transferring the write data latched by the first latch unit to the read bus line in response to the test mode signal; and
   a second latch unit, located on the read bus line, for latching the write data applied on the read bus line.

6. The multi-port memory device as recited in claim 5, wherein the data input unit includes:
   a first inverter for inverting the data flag signal;
   a first NMOS transistor having a gate receiving the data flag signal;
   a first PMOS transistor connected to the first NMOS transistor and having a gate receiving an output of the first inverter;
   a second NMOS transistor connected between the first NMOS transistor and a ground voltage terminal and having a gate receiving the write data; and
   a second PMOS transistor connected between the first PMOS transistor and a source voltage terminal and having a gate receiving the write data.

7. The multi-port memory device as recited in claim 5, wherein the data transferring unit includes a transfer gate for transferring the write data applied on the write bus line to the read bus line in response to the test mode signal.

8. The multi-port memory device as recited in claim 3, wherein the temporary data storage unit includes:
   a data input unit for receiving the write data to apply the received a write data to the write bus line in response to a data flag signal indicating a point of inputting the write data;
   a first latch unit, located on the write bus line, for latching the write data applied to the write bus line;
   a plurality of first data transferring units for transferring the write data latched by the first latch unit to an intermediate read bus line based on the test mode signal and test address signals from an external source;
   a plurality of second latch units, located on the intermediate read bus line, for latching the write data transferred from the first data transferring units; and
   a plurality of second data transferring units for transferring the write data latched by the second latch units to the read bus line based on the test mode signal, the test address signals and a read flag signal.

9. The multi-port memory device as recited in claim 8, wherein each of the number of first and second data transferring units, and second latch units corresponds to the number of write operations to do.

10. The multi-port memory device as recited in claim 9, wherein the data input unit includes:
    a first inverter for inverting the data flag signal;
    a first NMOS transistor having a gate receiving the data flag signal;
    a first PMOS transistor connected to the first NMOS transistor and having a gate receiving an output of the first inverter;
    a second NMOS transistor connected between the first NMOS transistor and a ground voltage terminal and having a gate receiving the write data; and
    a second PMOS transistor connected between the first PMOS transistor and a source voltage terminal and having a gate receiving the write data.

11. The multi-port memory device as recited in claim 9, wherein each of the first data transferring units includes:
    a first logic gate for performing a NAND operation of the test mode signal and a corresponding one of the test address signals; and
    a first transfer gate for transferring the write data latched by the first latch unit in response to an output of the first logic gate.

12. The multi-port memory device as recited in claim 11, wherein each of the second data transferring units includes:
    an inverter for inverting the output of the first logic gate of the corresponding one of the first data transferring units;
    a second logic gate for performing a NAND operation of an output of the inverter and the read flag signal; and
    a second transfer gate for transferring the write data latched by a corresponding one of the second latch units to the read bus line in response to an output of the second logic gate.

13. The multi-port memory device as recited in claim 3, wherein the read/write control unit includes:

a write signal output unit for delaying the write flag signal by the predetermined time and outputting the delayed signal as the write signal; and a read signal output unit for outputting the read signal based on the test mode signal and the read flag signal.

14. The multi-port memory device as recited in claim 13, wherein the read signal output unit includes:
   a first inverter for inverting the test mode signal;
   a logic gate for performing a NAND operation of an output of the first inverter and the read flag signal; and
   a second inverter for inverting an output of the logic gate to output the read signal.

15. The multi-port memory device as recited in claim 13, wherein the write signal output unit includes a delay circuit including an even-numbers of inverters.

16. The multi-port memory device as recited in claim 3, wherein the read bus line is connected between the plurality of data bus sense amplifiers amplifying the read data and outputting the amplified data to an external device.

17. The multi-port memory device as recited in claim 3, wherein the write bus line is connected between the plurality of write drivers transferring the write data to the memory cell.

* * * * *